United States Patent [19]

Schweizer

[11] Patent Number: 4,879,476

[45] Date of Patent: Nov. 7, 1989

[54] METHOD AND APPARATUS FOR TRANSMITTING SIGNALS

[75] Inventor: Hartmut Schweizer, Korntal, Fed. Rep. of Germany

[73] Assignee: Robert Bosch GmbH, Stuttgart, Fed. Rep. of Germany

[21] Appl. No.: 627,744

[22] Filed: Jul. 5, 1984

[30] Foreign Application Priority Data

Sep. 6, 1983 [DE] Fed. Rep. of Germany ....... 3332037

[51] Int. Cl.⁴ .............................................. H02J 1/00
[52] U.S. Cl. ................................... 307/10.1; 307/116; 307/140
[58] Field of Search .................. 307/10 R, 38–41, 307/112, 113, 115, 116, 130, 131, 140, 114, 152

[56] References Cited

U.S. PATENT DOCUMENTS

| 4,453,088 | 6/1984 | Moore | 307/10 R |
| 4,454,560 | 6/1984 | Nakao et al. | 307/10 R |
| 4,514,645 | 4/1985 | Endo et al. | 307/10 R |

Primary Examiner—Derek S. Jennings
Attorney, Agent, or Firm—Michael J. Striker

[57] ABSTRACT

In a method and apparatus for transmitting signals from a control device to a diagnostic device in a motor vehicle, a transmission of signals in a serial form is obtained by means of an electric current. In order to detect whether the diagnostic device is connected to the control device a voltage is measured in a diagnostic signal-conducting lead connected to the diagnostic device. This voltage is varied by means of a resistor mounted at the input of the diagnostic device when the diagnostic device is connected to the control device.

4 Claims, 1 Drawing Sheet

METHOD AND APPARATUS FOR TRANSMITTING SIGNALS

BACKGROUND OF THE INVENTION

The present invention relates to a method and apparatus for transmitting signals in a serial form from a control device to a diagnostic device of a motor vehicle by means of a diagnostic data lead interconnected between the control device and the diagnostic device.

Extremely complicated electronic switching devices have been always utilized in the electrical part of a motor vehicle. These devices have been used, for example for defining the time point of the ignition or the start time point and the duration of the fuel injection. For example, an ignition pulse can be released in dependence upon the parameters of the motor vehicle.

In order to ensure a reliable operation of the control device, which is normally operated with the aid of microprocessors, it has been necessary to examine a routine operation of the control device by means of diagnostic devices provided on the vehicle in spaced relationship with each other. For this purpose the diagnostic devices are connected to the control device of the motor vehicle, thereby the function of the control device has been examined. The transmission of signals generated by the control device has been obtained in the serial form in a diagnostic data lead. In order to cause the control device to transmit data to the diagnostic device stimulus signals from the diagnostic device have been delivered to the control device, or certain arrangements in the control device have been necessary. This procedure has been actually troublesome because the data transmission must have been induced by an external handle. On the one hand, there has been a possibility that in the case of malfunction false data could be released, which could be connected with a defect of the control device, and on the other hand, an actuation of a switch, for example in the control device could lead to the fact that the switch, after being inserted into the motor vehicle, would remain in the diagnostic position, so that the control device would not reliably operate in that inserted position.

SUMMARY OF THE INVENTION

It is an object of the present invention to provide an improved method and device for transmitting signals in the serial form from the control device to the diagnostic device of a motor vehicle.

This and other objects of the invention are attained by a method of transmitting signals in a serial form from a control device to a diagnostic device of a motor vehicle by means of a diagnostic data lead connected to the diagnostic device, wherein the transmission of the signals is obtained by current, and wherein a voltage is measured at said diagnostic data lead to detect whether the diagnostic device is connected to the control device.

The basic advantage of the proposed method and device resides in that, after the connection of the diagnostic device to the control device, diagnostic data are automatically transmitted to the diagnostic device. A further advantage of the method according to the present invention is that additional control leads or modifications in existing diagnostic connections are not necessary because the additional leads or switch contacts are not required in current supply lines The device according to the invention is simple and does not require modifications in the diagnostic device or in the connection cables.

It is particularly advantageous that the transmission of signals from the control device to the diagnostic device can be obtained first when the connection of the diagnostic device with the control device is detected. Due to this feature of the invention it is ensured that the data transmission starts only when a reliable connection between the diagnostic device and the control device is established.

The objects of the present invention are further attained by an apparatus for transmitting signals in a serial form from a control device to a diagnostic device of a motor vehicle, comprising current source means connected to the control device and operative for the transmission of signals by current; a diagnostic data lead interconnected between said current source means and the diagnostic device so that a voltage can be measured at said lead to detect whether the diagnostic device is connected to the control device; and comparator means interconnected between said diagnostic data lead and the control device.

The apparatus may further include a reference voltage source connected to said comparator means, said comparator means being operative for comparing at least a portion of the voltage measured at said diagnostic data lead with a reference voltage of said reference voltage source for switching on said comparator means. This is a specifically simple means because it requires only insignificant additional parts and operates in a simple and reliable manner.

The reference voltage source may be switchable when the connection of the diagnostic device with the control device is detected.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawing.

DETAILED DESCRIPTION OF THE PREFERRED EMBODIMENT

Figure 1:
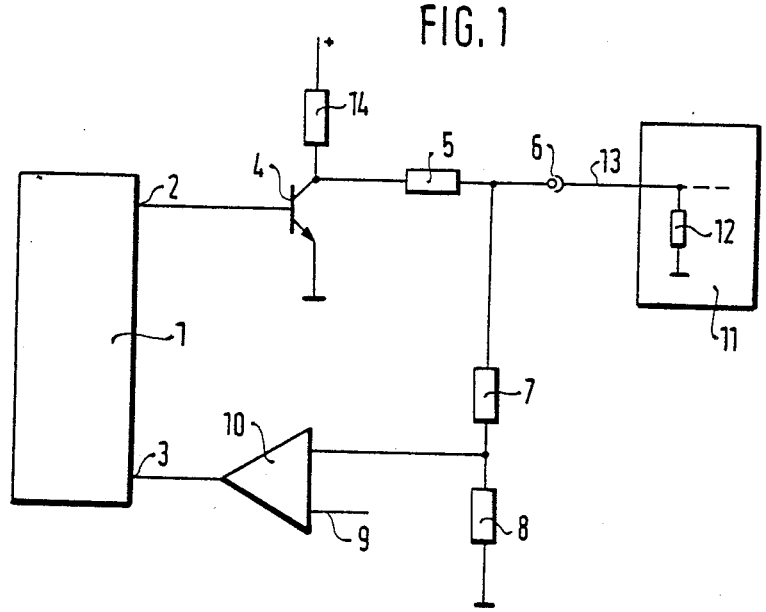
FIG. 1 is a diagram representing the method of and the device for signal transmitting, according to a first embodiment of the invention.

Referring now to the drawings more specifically, FIG. 1 illustrates a control device 1 which can be, for example utilized as an ignition control device in a motor vehicle. Besides the non-illustrated control input and control output of the control device 1 the latter has a diagnostic output 2 which is connected to the base of a transistor 4. The collector of transistor 4 is in turn connected to a resistor 5 which is coupled at the other side thereof with a plug connection 6. Furthermore, the collector of transistor 4 is, via resistor 14, connected to the positive voltage supply. A diagnostic lead 13, which is connected to the plug connection 6, also leads to a diagnostic device 11, At the input of diagnostic device 11 is provided an internal resistor 12. This resistor in the exemplified embodiment is connected to the ground. It is also possible that the diagnostic device would have a resistor which would be bridged to a voltage supply lead, for example a light diode, if a galvanic uncoupling at the input of the diagnostic device were desired. This invention will be explained below taking into consideration that the resistor of the diagnostic device is connected to the ground.

Between resistor 5 and plug connection 6 is connected a resistor 7 which is connected in series with a resistor 8 while the latter is coupled to the ground. The lead leading from the connecting point between the resistors 7 and 8 is connected to one input of a comparator 10. A reference voltage is fed to another input 9 of comparator 10. The output of comparator 10 is in connection with an input 3 of control device 1 which provides a release and reading out of diagnostic signals. All resistors and semiconductors which are positioned before the plug connection 6 are shown only for the half of control device 1. It is to be understood that these component parts can be incorporated in the control device.

With the shown connection arrangement it is possible to detect whether the diagnostic device 11 is connected to the control device or not and to transmit respective diagnostic signals when the diagnostic device is connected to the control device. Therefore the comparator 10 determines as to what voltage is generated in the diagnostic lead 13. If no diagnostic signals are to be transmitted a logic 0 is released at the diagnostic output 2. Thereby transistor 4 is blocked. An operation voltage of the control device 1 is fed to plug connection 6 via resistors 14 and 5. A high measuring or testing voltage develops accordingly on the measuring input of comparator 10, which testing voltage exceeds the reference voltage at input 9. This will cause the blocking of the release input 3 so that diagnostic signals would not be transmitted to the control device.

If the diagnostic device 11 is now connected with the control device 1 through the plug contact 6 in the diagnostic lead 13 then resistors 14 and 5 together with internal resistor 12 of the diagnostic device 11 will build a voltage portion which will decrease the voltage at the plug contact 6. The voltage at the measuring input of comparator 10 will decline by the same value. Thereby the reference voltage at input 9 of comparator 10 will fall below and the output of comparator 10 will be switched over. At the input 3 of control device 1 will be now applied a switched-over signal which will cause the control device 3 to deliver, via the diagnostic output 2, diagnostic signals in serial form. Transistor 4 is thereby cyclically opened so that the current conducted through the resistors to the data lead 13 is changed. In the illustrated embodiment, due to the pass-over switching of transistor 4, the voltage between resistor 14 and resistor 5 is short-circuited so that the current in the data lead 13 and also the voltage at the plug contact 6 are declined even stronger. The plugged-in diagnostic device 11 is also detected by comparator 10.

By means of a switchable reference voltage source connected to input 9 of comparator 10 it is possible to detect whether the information is transmitted correctly. This occurs when a voltage fluctuation depending upon current fluctuations develops at the measuring input of the comparator, which voltage fluctuation lies below the initial reference voltage. If a new reference voltage lies between two voltage values then it can be examined by the control device 1 whether diagnostic signals are correctly transmitted to the diagnostic device 11. This is possible in a specifically simple manner by means of a conventional microcomputer mounted in the control device. This microcomputer will examine whether a signal sequence applied to the input 3 of control device 3 corresponds to the signal sequence which was just delivered. The control device 1 is hence in such a position in which a reliable delivery of diagnostic signals is examined.

It is essential that the determination, as to whether an external device is switched on, is obtained via the measurement of the voltage, whereas the transmission of signals to the external device is obtained by the measurement of the current in the diagnostic device 11.

Figure 2:
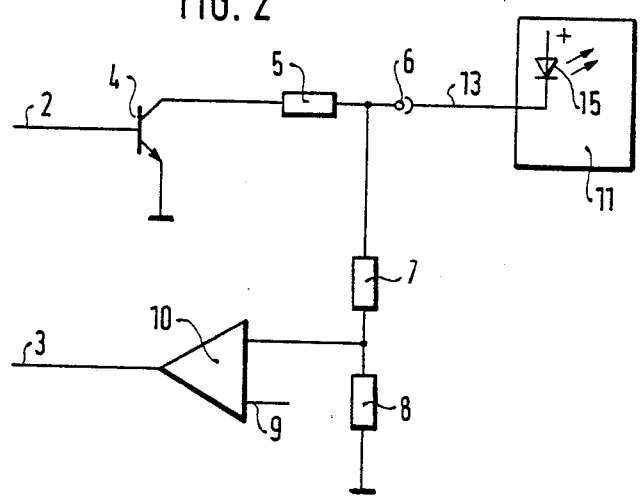
FIG. 2 is a diagram representing the signal transmission device of the second embodiment of the invention.

In the embodiment illustrated in FIG. 2, which is basically similar to that of FIG. 1, resistor 14, however, is not provided at the collector of transistor 4, but instead a resistor, preferably a light-emitting diode 15 of an optocoupler s provided in diagnostic device 11. Light-emitting diode 15 is coupled to the positive voltage supply. The base of transistor 4 is connected to the diagnostic output 2 of the control device similarly to the embodiment of FIG. 1, and the collector of transistor 4 is coupled to resistor 5 connected in the diagnostic lead 13 before plug connection 6. A portion of the diagnostic voltage is fed to the input of comparator 10, and this portion is defined by the ratio between the resistance values of resistors 7 and 8. The output of comparator 10 is in connection with the input 3 of control device 3 not shown in the diagram of FIG. 2. Reference voltage from the reference voltage source, not shown herein, is applied to lead 9 which is connected to the second input of comparator 10.

If the diagnostic device is not switched to the control device 1 then no voltage can be measured at the plug connection. No voltage thus occurs at the input of comparator 10 so that it is determined that the diagnostic device is not connected to the control device. If the diagnostic device is in fact connected to the control device the positive operation voltage of diagnostic device 11 is applied via the light-emitting diode 15 to the plug connection 6. At the input of comparator 10 then occurs the voltage, the value of which is greater than that of the reference voltage in the lead 9. Comparator 10 now detects the switching-on of the diagnostic device and enables the control device to read out diagnostic data. A further way of operation of the device of FIG. 2 corresponds to the above-described mode of operation of the embodiment of FIG. 1. The arrangement depicted in FIG. 2 has the advantage that in the event of a short circuiting of plug contact 6 to the ground the diagnostic data are not released so that in the case of malfunction in the motor vehicle, equipped with the device according to the invention, a start up of the diagnostic device of the control device does not occur. Therefore, the operational safety of the arrangement is further enhanced It will be understood that each of the elements described above, or two or more together, may also find a useful application in other types of methods and apparatus for transmitting signals from control devices to diagnostic devices differing from the types described above.

While the invention has been illustrated and described as embodied in a method and apparatus for transmitting signals from a control device to a diagnostic device, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims,

I claim:

1. In a method of transmitting signals in a serial form from a control device to a diagnostic device of a motor vehicle by means of a diagnostic data-conducting lead interconnected between the diagnostic device and the control device, the improvement comprising the steps providing current source means immediately in the control device so that signals are transmitted from the control device to the diagnostic device through said data-conducting lead as a current, and measuring voltage at said diagnostic data lead to detect whether the diagnostic device is connected to the control device whereby diagnostic data are automatically transmitted from the control device to the diagnostic device when the connection of the diagnostic device with the control device is detected.

2. An apparatus for transmitting signals in a serial form from a control device to a diagnostic device of a motor vehicle, comprising current source means (4, 5, 14) provided immediately on the control device and being operative for the transmission of signals by current; a diagnostic data lead interconnected between said current source means and the diagnostic device, so that voltage can be measured at said lead to detect whether the diagnostic device is connected to the control device; and comparator means interconnected between said diagnostic data lead and the control device.

3. The apparatus as defined in claim 2, further including a reference voltage source connected to said comparator means, said comparator means being operative for comparing at least a portion of the voltage measured at said diagnostic data lead with at least one reference voltage of said reference voltage source for switching on said comparator means.

4. The apparatus as defined in claim 3, wherein said reference voltage is switchable when the connection of the diagnostic device with the control device is detected.

* * * * *